(12) United States Patent
Shen et al.

(10) Patent No.: US 12,166,114 B2
(45) Date of Patent: Dec. 10, 2024

(54) SEMICONDUCTOR DEVICE STRUCTURES AND METHODS OF MANUFACTURING THE SAME

(71) Applicant: INNOSCIENCE (SUZHOU) SEMICONDUCTOR CO., LTD., Suzhou (CN)

(72) Inventors: Jingyu Shen, Suzhou (CN); Qiyue Zhao, Suzhou (CN); Chunhua Zhou, Suzhou (CN); Chao Yang, Suzhou (CN); Wuhao Gao, Suzhou (CN); Yu Shi, Suzhou (CN); Baoli Wei, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 643 days.

(21) Appl. No.: 17/289,732

(22) PCT Filed: Jan. 27, 2021

(86) PCT No.: PCT/CN2021/073929
§ 371 (c)(1),
(2) Date: Apr. 29, 2021

(87) PCT Pub. No.: WO2022/160116
PCT Pub. Date: Aug. 4, 2022

(65) Prior Publication Data
US 2022/0384628 A1 Dec. 1, 2022

(51) Int. Cl.
*H01L 29/778* (2006.01)
*H01L 21/768* (2006.01)
(Continued)

(52) U.S. Cl.
CPC .... *H01L 29/7786* (2013.01); *H01L 21/76898* (2013.01); *H01L 23/481* (2013.01);
(Continued)

(58) Field of Classification Search
CPC ........... H01L 29/7786; H01L 21/76898; H01L 25/117; H01L 29/2003; H01L 29/205;
(Continued)

(56) References Cited

U.S. PATENT DOCUMENTS

| 10,706,900 B2 | 7/2020 | Navaratnam et al. |
| 2009/0014888 A1* | 1/2009 | Lee .................. H01L 21/76898 257/E23.141 |

(Continued)

FOREIGN PATENT DOCUMENTS

| CN | 101345231 A | 1/2009 |
| CN | 103000571 A | 3/2013 |

(Continued)

OTHER PUBLICATIONS

International Search Report and Written Opinion of the corresponding PCT application No. PCT/CN2021/073929 mailed on Nov. 2, 2021.
(Continued)

*Primary Examiner* — Syed I Gheyas
(74) *Attorney, Agent, or Firm* — JCIPRNET

(57) ABSTRACT

Semiconductor device structures and methods for manufacturing the same are provided. The semiconductor device structure includes a substrate, a first nitride semiconductor layer, a second nitride semiconductor layer, a gate electrode, a first electrode, a first via and a second via. The substrate has a first surface and a second surface. The first nitride semiconductor layer is disposed on the first surface of the substrate. The second nitride semiconductor layer is disposed on the first nitride semiconductor layer and has a
(Continued)

bandgap exceeding that of the first nitride semiconductor layer. The gate electrode and the first electrode are disposed on the second nitride semiconductor layer. The first via extends from the second surface and is electrically connected to the first electrode. The second via extends from the second surface. The depth of the first via is different from the depth of the second via.

20 Claims, 10 Drawing Sheets

(51) Int. Cl.
  H01L 23/48     (2006.01)
  H01L 25/00     (2006.01)
  H01L 25/11     (2006.01)
  H01L 29/20     (2006.01)
  H01L 29/205    (2006.01)
  H01L 29/66     (2006.01)
  H01L 23/00     (2006.01)
(52) U.S. Cl.
  CPC ............ *H01L 25/117* (2013.01); *H01L 25/50* (2013.01); *H01L 29/2003* (2013.01); *H01L 29/205* (2013.01); *H01L 29/66462* (2013.01); *H01L 24/16* (2013.01); *H01L 2224/16146* (2013.01); *H01L 2224/16235* (2013.01)
(58) Field of Classification Search
  CPC ............... H01L 29/66462; H01L 24/16; H01L 2224/16146
  See application file for complete search history.

(56) References Cited

U.S. PATENT DOCUMENTS

| | | | |
|---|---|---|---|
| 2010/0140775 A1* | 6/2010 | Jung | H01L 25/0657 977/762 |
| 2010/0301396 A1 | 12/2010 | Briere | |
| 2015/0056763 A1 | 2/2015 | Hobart et al. | |
| 2015/0102497 A1* | 4/2015 | Park | H01L 21/6835 257/774 |
| 2022/0020669 A1* | 1/2022 | Mcknight-Macneil | H01L 23/3677 |

FOREIGN PATENT DOCUMENTS

| | | | |
|---|---|---|---|
| CN | 103311289 A | | 9/2013 |
| CN | 104428887 A | | 3/2015 |
| CN | 105993078 A | | 10/2016 |
| CN | 107230718 A | | 10/2017 |
| CN | 109545850 A | | 3/2019 |
| CN | 109659366 A | | 4/2019 |
| CN | 110970498 A | | 4/2020 |
| CN | 111682860 A | * | 9/2020 |
| JP | 2009212103 A | | 9/2009 |

OTHER PUBLICATIONS

First Office Action of the corresponding China patent application No. 202180000644.9 mailed on Dec. 10, 2021.

* cited by examiner

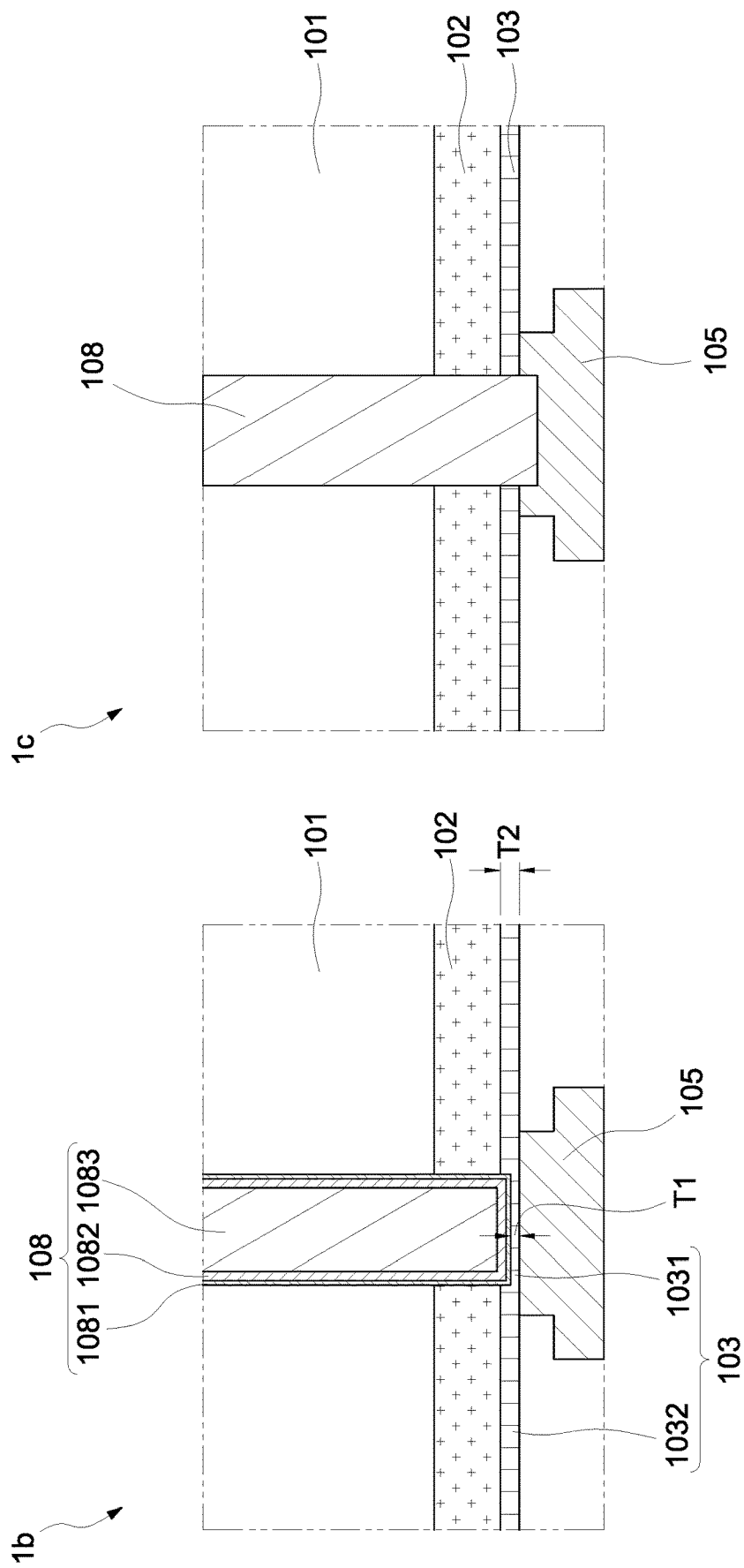

SEMICONDUCTOR DEVICE STRUCTURES AND METHODS OF MANUFACTURING THE SAME

BACKGROUND

1. Field of the Disclosure

The present disclosure relates to a semiconductor device structure and more particularly to a semiconductor device structure with via(s) connecting different electronic components.

2. Description of Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies).

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device structure includes a substrate, a first nitride semiconductor layer, a second nitride semiconductor layer, a gate electrode, a first electrode, a first via and a second via. The substrate has a first surface and a second surface opposite to the first surface. The first nitride semiconductor layer is disposed on the first surface of the substrate. The second nitride semiconductor layer is disposed on the first nitride semiconductor layer and has a bandgap greater than that of the first nitride semiconductor layer. The gate electrode is disposed on the second nitride semiconductor layer. The first electrode is disposed on the second nitride semiconductor layer. The first via extends from the second surface and is electrically connected to the first electrode. The second via extends from the second surface. The depth of the first via is different from the depth of the second via.

According to some embodiments of the present disclosure, a semiconductor device structure includes a first electronic component and a second electronic component. The first electronic component has an active surface and a back surface opposite to the active surface. The second electronic component is electrically connected to the first electronic component and has an active surface facing the back surface of the first electronic component. The first electronic component includes a substrate, a first nitride semiconductor layer, a second nitride semiconductor layer, a gate electrode, a first electrode and a first via. The substrate is adjacent to the back surface of the first electronic component. The first nitride semiconductor layer is disposed on the substrate. The second nitride semiconductor layer is disposed on the first nitride semiconductor layer and has a bandgap greater than that of the first nitride semiconductor layer. The gate electrode is disposed on the second nitride semiconductor layer. The first electrode is disposed on the second nitride semiconductor layer. The first via extends from the back surface of the first electronic component and electrically connects the first electrode and the second electronic component.

According to some embodiments of the present disclosure, a method of manufacturing a semiconductor device structure includes providing a first electronic component having an active surface and a back surface opposite to the active surface. The first electronic component includes a substrate, a first nitride semiconductor layer, a second nitride semiconductor layer, a gate electrode and a first electrode. The substrate is adjacent to the back surface of the first electronic component. The first nitride semiconductor layer is disposed on the substrate. The second nitride semiconductor layer is disposed on the first nitride semiconductor layer and has a bandgap greater than that of the first nitride semiconductor layer. The gate electrode is disposed on the second nitride semiconductor layer. The first electrode is disposed on the second nitride semiconductor layer. The method also includes forming a first via extending between the back surface and the first electrode of the first electronic component. The method further includes bonding a second electronic component to the first electronic component. The second electronic component is electrically connected to the first electrode through the first via.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 4 is a partial cross-sectional view of a semiconductor device structure in accordance with some embodiments of the present disclosure.

FIG. 5 is a partial cross-sectional view of a semiconductor device structure in accordance with some embodiments of the present disclosure.

Figure 1:
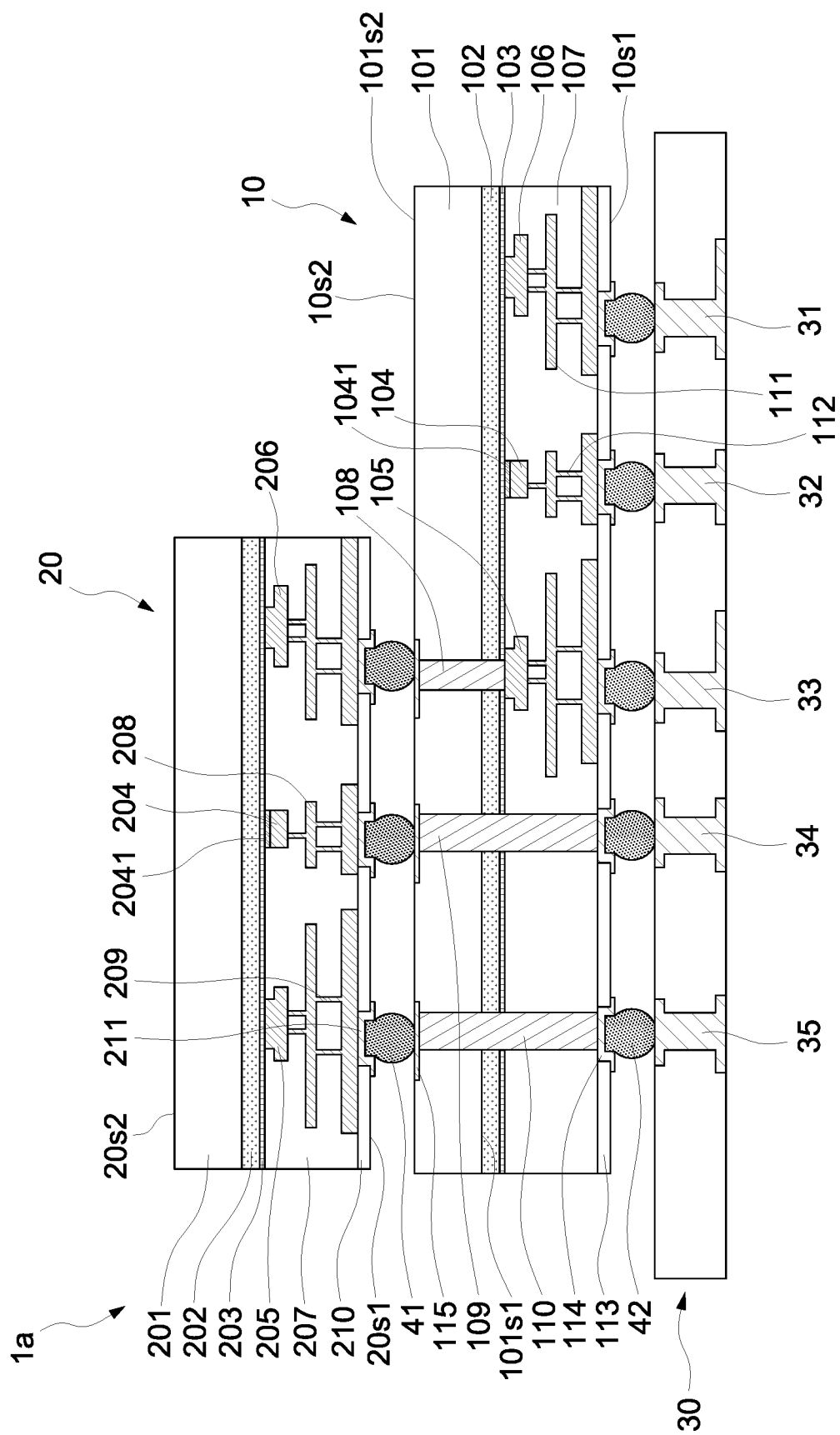
FIG. 1 is a cross-sectional view of a semiconductor device structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

The present disclosure provides a semiconductor device structure including two electronic components. These two electronic components may be electrically connected to each other by a via extended from a back surface of one of the electronic component. This electronic component may further include another via for electrically connecting another electronic component to a circuit board. Thus, these two electronic components and the circuit board may be stacked vertically, which can reduce the overall size of a semiconductor package structure.

FIG. 1 is a cross-sectional view of a semiconductor device structure 1a in accordance with some embodiments of the present disclosure. The semiconductor device structure 1a may include an electronic component 10, an electronic component 20 and a circuit board 30, terminals 41 and terminals 42.

The electronic component 10 may include a surface 10s1 and a surface 10s2. The surface 10s1 (or an active surface) may be adjacent to the circuit board 30. The surface 10s2 (or a back surface) may be opposite to the surface 10s1. The surface 10s2 may be adjacent to the electronic component 20. In this disclosure, the active surface may be defined as a surface closer to metal layers, such as M1 layer (the first metal layer) or the M2 layer (the second metal layer), than the back surface. Alternatively, the active surface may be defined as a surface further from the substrate than the back surface.

The electronic component 10 may be a HEMT device. The electronic component 10 may include a substrate 101, a nitride semiconductor layer 102, a nitride semiconductor layer 103, a gate electrode 104, an electrode 105, an electrode 106, a dielectric layer 107, a via 108, a via 109 and a via 110.

The substrate 101 may be adjacent to the surface 10s2 of the electronic component 10. The substrate 101 may include, without limitation, silicon (Si), doped Si, silicon carbide (SiC), germanium silicide (SiGe), gallium arsenide (GaAs), or other semiconductor materials. The substrate 101 may include, without limitation, sapphire, silicon on insulator (SOI), or other suitable materials.

The substrate 101 may include a surface 101s1 and a surface 101s2. The surface 101s1 may be adjacent to the nitride semiconductor layer 102. The surface 101s2 may be opposite to the surface 101s1. The surface 101s2 may also be defined as the surface 10s2 of the electronic component 10.

The semiconductor device structure 1a may further include a buffer layer (not shown). The buffer layer may be disposed on the surface 101s1 of the substrate 101. The buffer layer may be configured to reduce defect(s) resulting from dislocation between the substrate 101 and the nitride semiconductor layer 102. The buffer layer may include, but is not limited to, nitride, such as AlN, AlGaN or the like.

The nitride semiconductor layer 102 may be disposed on the substrate 101. The nitride semiconductor layer 102 may be disposed on the surface 101s1 of the substrate 101. The nitride semiconductor layer 102 may include a group III-V layer. The nitride semiconductor layer 102 may include, but is not limited to, a group III nitride, for example, a compound $In_aAl_bGa_{1-a-b}N$, in which a+b≤1. The group III nitride further includes, but is not limited to, for example, a compound $Al_aGa_{(1-a)}N$, in which a≤1. The nitride semiconductor layer 102 may include a gallium nitride (GaN) layer. GaN has a bandgap of about 3.4 eV. The thickness of the nitride semiconductor layer 102 may range, but is not limited to, from about 0.1 μm to about 1 μm.

The nitride semiconductor layer 103 may be disposed on the nitride semiconductor layer 102. The nitride semiconductor layer 103 may include a group III-V layer. The nitride semiconductor layer 103 may include, but is not limited to, a group III nitride, for example, a compound $In_aAl_bGa_{1-a-b}N$, in which a+b≤1. The group III nitride may further include, but is not limited to, for example, a compound $Al_aGa_{(1-a)}N$, in which a≤1. The nitride semiconductor layer 103 may have a bandgap exceeding that of the nitride semiconductor layer 102. The nitride semiconductor layer 103 may include an aluminum gallium nitride (AlGaN) layer. AlGaN has a bandgap of about 4.0 eV. The thickness of the nitride semiconductor layer 103 may range, but is not limited to, from about 10 nm to about 100 nm.

A heterojunction is formed between the nitride semiconductor layer 103 and the nitride semiconductor layer 102, and the polarization of the heterojunction forms a two-dimensional electron gas (2DEG) region in the layer of less bandgap, such as the nitride semiconductor layer 102.

The gate electrode 104 may be disposed on the nitride semiconductor layer 103. The gate electrode 104 may include a gate metal. The gate metal may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The gate electrode 104 may include a nitride semiconductor layer 1041 (or a depletion layer). The nitride semiconductor layer 1041 may be disposed on the nitride semiconductor layer 103. The nitride semiconductor layer 1041 may be in direct contact with the nitride semiconductor layer 103. The nitride semiconductor layer 1041 may be doped with impurities. The nitride semiconductor layer 1041 may include p-type dopants. It is contemplated that the nitride semiconductor layer 1041 may include a p-doped GaN layer, p-doped AlGaN layer, p-doped AlN layer or other suitable III-V group layers. The p-type dopants may include magnesium (Mg), beryllium (Be), zinc (Zn) and cadmium (Cd). The nitride semiconductor layer 1041 may be configured to control the concentration of the 2DEG in the nitride semiconductor layer 102. The nitride semiconductor layer 1041 can be used to deplete the 2DEG directly under the nitride semiconductor layer 1041.

The electrode 105 (or a source electrode or a source structure) may be disposed on the nitride semiconductor layer 103. The electrode 105 may be in contact with the nitride semiconductor layer 103. The electrode 105 may include, for example, without limitation, a conductive material. The conductive material may include metals, alloys, doped semiconductor materials (e.g., doped crystalline silicon), or other suitable conductive materials, such as Ti, Al, Ni, Cu, Au, Pt, Pd, W, TiN or other suitable materials.

The electrode 106 (or a drain electrode or a drain structure) may be disposed on the nitride semiconductor layer 103. The electrode 106 may be in contact with the nitride semiconductor layer 103. The electrode 106 may include, for example, without limitation, a conductive material. The conductive materials may include metals, alloys, doped semiconductor materials (e.g., doped crystalline silicon), or other suitable conductive materials, such as Ti, Al, Ni, Cu, Au, Pt, Pd, W, TiN or other suitable materials.

The electrode 105 and the electrode 106 may be disposed on two opposite sides of the gate electrode 104. Although the electrode 105 and the electrode 106 are disposed on two opposite sides of the gate electrode 104 in FIG. 1, the electrode 105, the electrode 106, and the gate electrode 104 may have different configurations in other embodiments of the present disclosure due to the design requirements.

Although it is not illustrated in FIG. 1, however, it is contemplated that structure of the electrode 105 can be varied or changed in some other embodiments of the subject application. Although it is not illustrated in FIG. 1, however, it is contemplated that structure of the electrode 106 can be varied or changed in some other embodiments of the subject application. For example, a portion of the electrode 105 may be located or extended in the nitride semiconductor layer 102. A portion of the electrode 106 may be located or extended in the nitride semiconductor layer 102. The electrode 105 may be disposed on the nitride semiconductor layer 102. The electrode 106 may be disposed on the nitride semiconductor layer 102. The electrode 105 may penetrate the nitride semiconductor layer 103 to contact the nitride semiconductor layer 102. The electrode 106 may penetrate the nitride semiconductor layer 103 to contact the nitride semiconductor layer 102.

The dielectric layer 107 may be disposed on the nitride semiconductor layer 103. The dielectric layer 107 may cover the gate electrode 104. The dielectric layer 107 may cover the electrode 105. The dielectric layer 107 may cover the electrode 106. The dielectric layer 107 may include low-k materials. The dielectric layer 107 may include high-k materials. The dielectric layer 107 may include oxide, nitride, oxynitride, or other suitable materials.

The via 108 may extend from the surface $10s2$ of the electronic component 10. The via 108 may extend from the surface $101s2$ of the substrate 101. The via 108 may extend between the surface $101s2$ of the substrate 101 and the electrode 105. The via 108 may be electrically connected to the electrode 105. The via 108 may electrically connect the electronic component 20 and the electronic component 10. The via 108 may electrically connect the electronic component 20 to an active element of the electronic component 10. The via 108 may electrically connect the electronic component 20 and the electrode 105. The via 108 may penetrate the substrate 101. The via 108 may penetrate the nitride semiconductor layer 102. The via 108 may penetrate the nitride semiconductor layer 103. The via 108 may not penetrate the dielectric layer 107. The via 108 may be spaced apart from the dielectric layer 107. The via 108 may be vertically aligned to an active element of the electronic component 10. The via 108 may be vertically aligned to electrode 105. The via 108 may extend vertically and continuously from one of the terminals 41 to the electrode 105. The material of the via 108 may include Ti, Cu, Al or other suitable materials.

The via 109 may extend from the surface $10s2$ of the electronic component 10. The via 109 may extend from the surface $101s2$ of the substrate 101. The via 109 may extend between the surface $10s2$ of the electronic component 10 and the surface $10s1$ of the electronic component 10. The via 109 may electrically connect the electronic component 20 and the circuit board 30. The via 109 may be spaced apart from the active elements, such as the gate electrode 104, electrode 105 and electrode 106, of the electronic component 10. The via 109 may be vertically free from overlapping the active elements, such as the gate electrode 104, electrode 105 and electrode 106, of the electronic component 10. The depth of the via 109 may be different from the depth of the via 108. The depth of the via 109 may be greater than the depth of the via 108. The length along a vertical direction (or vertical axis), defined by from the surface $10s1$ to the surface $10s2$, of the via 109 may be different from that of the via 108. The length along the vertical direction of the via 109 may be greater than that of the via 108. The via 109 may penetrate the substrate 101. The via 109 may penetrate the nitride semiconductor layer 102. The via 109 may penetrate the nitride semiconductor layer 103. The via 109 may penetrate the dielectric layer 107. The material of the via 109 may include Al, Cu or other suitable materials. The material of the via 109 may be different from that of the via 108.

The via 110 may extend from the surface $10s2$ of the electronic component 10. The via 110 may extend from the surface $101s2$ of the substrate 101. The via 110 may extend between the surface $10s2$ of the electronic component 10 and the surface $10s1$ of the electronic component 10. The via 110 may electrically connect the electronic component 20 and the circuit board 30. The via 110 may be spaced apart from the active elements, such as the gate electrode 104, electrode 105 and electrode 106, of the electronic component 10. The via 110 may be vertically free from overlapping the active elements, such as the gate electrode 104, electrode 105 and electrode 106, of the electronic component 10. The depth of the via 110 may be substantially the same as that of the via 109. The via 110 may penetrate the substrate 101. The via 110 may penetrate the nitride semiconductor layer 102. The via 110 may penetrate the nitride semiconductor layer 103. The via 110 may penetrate the dielectric layer 107. The material of the via 110 may include Al, Cu or other suitable materials. The material of the via 110 may be the same as that of the via 109.

It is contemplated that the semiconductor device structure 1a may include pad(s) 115. The pad(s) 115 may be disposed on the surface $101s2$ of the substrate 101. The pad(s) 115 may be disposed between the via 108 and the terminal 41. The pad(s) 115 may be disposed between the via 109 and the terminal 41. The area of the pad(s) 115 may be greater than that of the via 108 from the top view.

The electronic component 10 may further include conductive layer 111($s$). The electronic component 10 may further include through-via 112($s$). The conductive layer 111 may include a M1 layer (or the first metal layer), a M2 layer (or the second metal layer) disposed on the M1 layer. The conductive layer 111 may include more metal layers. The through-via 112 may be disposed between two adjacent conductive layers 111. The conductive layer 111 and the through-via 112 may be embedded in the dielectric layer 107. The gate electrode 104 may be electrically connected to the circuit board 30 through the conductive layers 111 and the through-via 112. The electrode 105 may be electrically connected to the circuit board 30 through the conductive layers 111 and the through-vias 112. The electrode 106 may be electrically connected to the circuit board 30 through the conductive layers 111 and the through-vias 112. The conductive layer 111 may be separated from the via 109. The conductive layer 111 may be separated from the via 110.

The electronic component 10 may further include a passivation layer 113. The passivation layer 113 may be disposed on the dielectric layer 107. The passivation layer 113 may include dielectric material(s).

The electronic component 10 may further include a pad 114. The pad 114 may penetrate the passivation layer 113. The pad 114 may serve as Under Bump Metallurgy (UBM). The pad 114 may electrically connect to the via 109. The pad 114 may electrically connect to the via 110. The pad 114 may electrically connect to the conductive layer(s) 111 and the through-via(s) 112.

The electronic component 20 may be stacked on the electronic component 10. The electronic component 20 may have a surface 20s1 (or an active surface) and a surface 20s2 (or a back surface). The surface 20s1 may be adjacent to the surface 10s2. The surface 20s1 of the electronic component 20 may face the surface 10s2 of the electronic component 10. The surface 20s2 may be distant from the surface 10s2. The electronic component 20 may be smaller than the electronic component 10. For example, the length along a horizontal direction (or horizontal axis), which is perpendicular to the vertical direction, of the electronic component 20 may be less than that of the electronic component 10. The electronic component 20 may be a HEMT device.

The electronic component 20 may include a substrate 201, a nitride semiconductor layer 202, a nitride semiconductor layer 203, a gate electrode 204, an electrode 205, an electrode 206 and a dielectric layer 207.

The substrate 201 may be adjacent to the surface 20s2 of the electronic component 20. The substrate 201 may include, without limitation, silicon (Si), doped Si, silicon carbide (SiC), germanium silicide (SiGe), gallium arsenide (GaAs), or other semiconductor materials. The substrate 201 may include, without limitation, sapphire, silicon on insulator (SOI), or other suitable materials.

The nitride semiconductor layer 202 may be disposed on the substrate 201. The nitride semiconductor layer 202 may include a group III-V layer. The nitride semiconductor layer 202 may include, but is not limited to, a group III nitride, for example, a compound $In_aAl_bGa_{1-a-b}N$, in which $a+b\leq1$. The group III nitride further includes, but is not limited to, for example, a compound $Al_aGa_{(1-a)}N$, in which $a\leq1$. The nitride semiconductor layer 202 may include a GaN layer. The thickness of the nitride semiconductor layer 202 may range, but is not limited to, from about 0.1 μm to about 1 μm.

The nitride semiconductor layer 203 may be disposed on the nitride semiconductor layer 202. The nitride semiconductor layer 203 may include a group III-V layer. The nitride semiconductor layer 203 may include, but is not limited to, a group III nitride, for example, a compound $In_aAl_bGa_{1-a-b}N$, in which $a+b\leq1$. The group III nitride may further include, but is not limited to, for example, a compound $Al_aGa_{(1-a)}N$, in which $a\leq1$. The nitride semiconductor layer 203 may have a greater bandgap than that of the nitride semiconductor layer 202. The nitride semiconductor layer 203 may include an AlGaN layer. The thickness of the nitride semiconductor layer 203 may range, but is not limited to, from about 10 nm to about 100 nm.

A heterojunction is formed between the nitride semiconductor layer 203 and the nitride semiconductor layer 202, and the polarization of the heterojunction forms a 2DEG region in the layer that has less bandgap, such as the nitride semiconductor layer 202.

The gate electrode 204 may be disposed on the nitride semiconductor layer 203. The gate electrode 204 may be electrically connected to the circuit board 30 through the via 109. The nitride semiconductor layer 203 may include a gate metal, such as titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The gate electrode 204 may include a nitride semiconductor layer 2041 (or a depletion layer). The nitride semiconductor layer 2041 may be disposed on the nitride semiconductor layer 203. The nitride semiconductor layer 2041 may be in direct contact with the nitride semiconductor layer 203. The material of the nitride semiconductor layer 2041 may be the same as that of the nitride semiconductor layer 1041.

The electrode 205 (or a source electrode or a source structure) may be disposed on the nitride semiconductor layer 203. The electrode 205 may include, for example, without limitation, a conductive material. The conductive materials may include metals, alloys, doped semiconductor materials (e.g., doped crystalline silicon), or other suitable conductive materials, such as Ti, Al, Ni, Cu, Au, Pt, Pd, W, TiN or other suitable materials. The electrode 205 may be electrically connected to the circuit board 30 through the via 110. The electrode 205 may be electrically connected to ground. The electrode 205 may be electrically connected to virtual ground. The electrode 205 may be electrically connected to real ground.

The electrode 206 (or a drain electrode or a drain structure) may be disposed on the nitride semiconductor layer 203. The electrode 206 may include, for example, without limitation, a conductive material. The conductive materials may include metals, alloys, doped semiconductor materials (e.g., doped crystalline silicon), or other suitable conductive materials, such as Ti, Al, Ni, Cu, Au, Pt, Pd, W, TiN or other suitable materials. The electrode 206 may be horizontally closer to the active elements, such as the electrode 105, the electrode 106, the gate electrode 104, of the electronic component 10 than the gate electrode 204 is. The electrode 206 may be horizontally closer to the active elements, such as the electrode 105, the electrode 106, the gate electrode 104, of the electronic component 10 than the electrode 205 is. The electrode 206 may be electrically connected to the electrode 105 through the via 108.

The dielectric layer 207 may be disposed on the nitride semiconductor layer 203. The dielectric layer 207 may include low-k materials. The dielectric layer 207 may include high-k materials. The dielectric layer 207 may include oxide, nitride, oxynitride or other suitable materials.

The electronic component 20 may further include conductive layer(s) 208. The electronic component 20 may further include through-via(s) 209. The conductive layer(s) 208 may include a M1 layer, a M2 layer or more metal layers. The through-via(s) 209 may be configured to electrically connect two adjacent conductive layers 209.

The electronic component 20 may further include a passivation layer 210. The passivation layer 210 may be disposed on the dielectric layer 207. The passivation layer 210 may include dielectric material(s).

The electronic component 20 may further include a pad 211. The pad 211 may penetrate the passivation layer 210. The pad 211 may serve as Under Bump Metallurgy (UBM).

The terminals 41 may be disposed on the pad 211. The terminals 41 may be disposed between the electronic component 10 and the electronic component 20. The terminal 41 may include, for example, solder balls, solder bumps or other conductive bumps. One of the terminals 41 may be vertically aligned to the electrode 105. One of the terminals 41 may be vertically aligned to the via 108.

The terminals 42 may be disposed on the pad 114. The terminals 42 may be disposed between the electronic component 10 and the circuit board 30. The terminal 42 may include, for example, solder balls, solder bumps or other conductive bumps.

The circuit board 30 may be disposed adjacent to the surface 10s1 of the electronic component 10. The circuit board 30 may include a printed circuit board (PCB), a flexible printed circuit board (FPCB) or other suitable circuit boards. The circuit board 30 may include an electrode 31. The circuit board 30 may include an electrode 32. The circuit board 30 may include an electrode 33. The circuit board 30 may include an electrode 34. The circuit board 30 may include an electrode 35. The circuit board 30 may be electrically connected to the electronic component 20 through the via 109. The circuit board 30 may be electrically connected to the electronic component 20 through the via 110.

The electrode 31 may be electrically connected the electrode 106 of the electronic component 10. The electrode 32 may be electrically connected to the gate electrode 104 of the electronic component 10. The electrode 33 may be electrically connected to the electrode 105 of the electronic component 10. The electrode 33 may be electrically connected to the electrode 206 of the electronic component 20. The electrode 34 may be electrically connected to the gate electrode 204 of the electronic component 20. The electrode 35 may be electrically connected to the electrode 204 of the electronic component 20.

Figure 2:
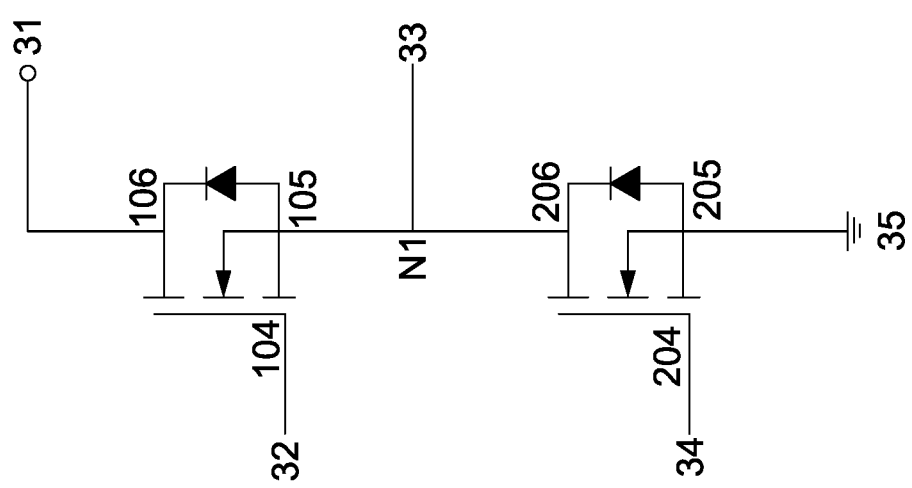
FIG. 2 is a circuit diagram of the semiconductor device structure of FIG. 1.

FIG. 2 illustrates a circuit diagram of the semiconductor device structure 1a of FIG. 1.

The electrode 31 may serve as a power supply to provide a voltage on the electrode 106. The gate electrode 104 may turn on current from the electrode 106 to the electrode 105. The gate electrode 104 may serve as a voltage converter. For example, the gate electrode 104 may convert voltage from the electrode 31 to a lower voltage into the electrode 33. The electrode 33 may be electrically connected to an additional electronic component (not shown). For example, when the electrode 33 receives sufficient voltage, the electrode 33 may serve as a switch to turn on the additional electronic component. The gate electrode 204 may be configured to stabilize the voltage imposed on the electrode 33. For example, when the electrode 33 receives an exceeded voltage, the gate electrode 204 may turn on a path from the electrode 206 to the electrode 205 such that current may diverge and further flow from the electrode 105 to the electrode 35, which may serves as a ground electrode, through the electrode 206 and the electrode 205, thereby stabilizing the voltage imposed on the electrode 33. As shown in FIG. 2, the electrode 105 may be electrically connected to the electrode 33 through a node N1. The electrode 105 may be electrically connected to the electrode 206 through the node N1.

As shown in FIG. 1, the electronic component 10, the electronic component 20 and the circuit board 30 may be vertically aligned with each other, which can reduce the overall size of the semiconductor device structure 1a. The via 108 is used to electrically connect the electronic component 10 and the electronic component 20. In comparison with using wire bond(s) to connect the electronic component 10 and the electronic component 20, using the via 108 may reduce parasitic capacitance. However, since it is difficult to control the etching depth of through-holes for forming the via 108 (e.g., the thickness of the electrode 105 is relatively less, and prone to over etching), a redistribution structure is used to connect the electronic components 10 and 20. Compared with use of the redistribution structure, using the via 108 can reduce the resist between the electrode 206 and the electrode 105 due to the relatively shorter path of the via 108.

Figure 3:
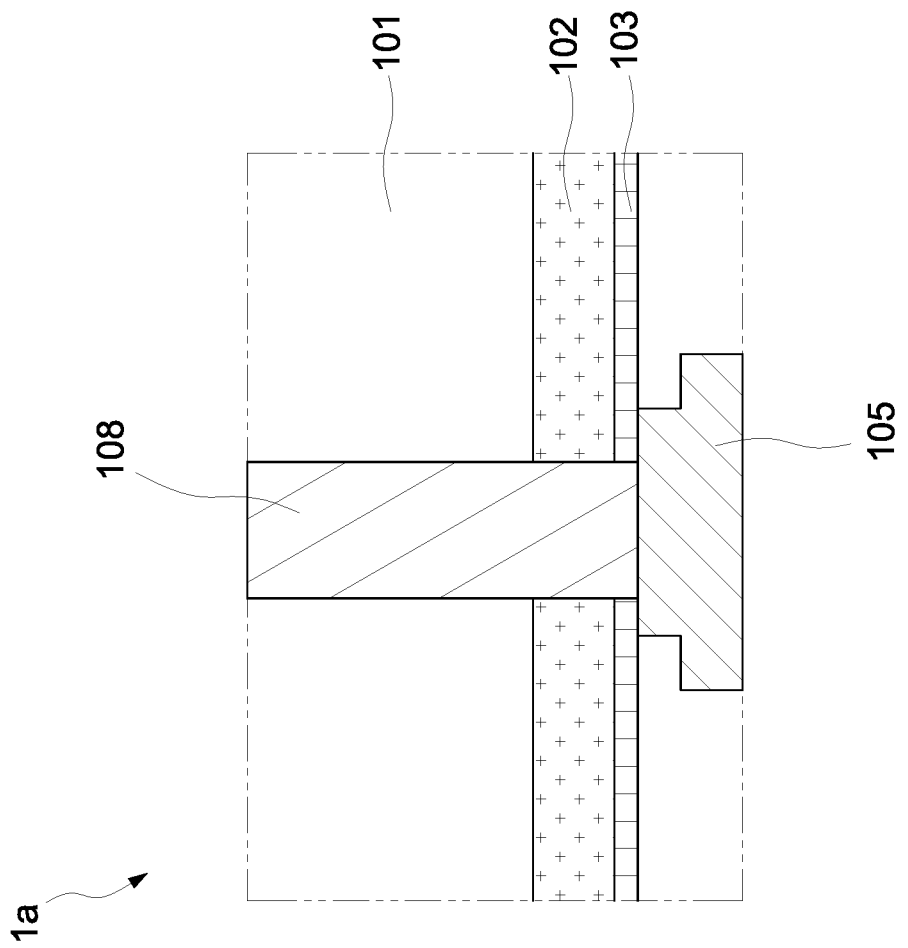
FIG. 3 is an enlarged view of the semiconductor device structure of FIG. 1.

FIG. 3 is an enlarged view of the semiconductor device structure 1a of FIG. 1.

The via 108 may terminate at the electrode 105. The via 108 may terminate at the upper surface of the electrode 105. The lower surface of the via 108 may be substantially coplanar with the lower surface of the nitride semiconductor layer 103.

FIG. 4 is a partial cross-sectional view of a semiconductor device structure 1b in accordance with some embodiments of the present disclosure.

The nitride semiconductor layer 103 may include a portion 1031 and a portion 1032. The portion 1031 may be located between the electrode 105 and the via 108. The portion 1032 may be adjacent to the portion 1031. The portion 1032 may be located between the electrode 105 and the substrate 101. The portion 1032 may be located between the dielectric layer 107 and the substrate 101. The portion 1032 may be located between the gate electrode 104 (shown in FIG. 1) and the substrate 101. A thickness T1 of the portion 1031 may be different from a thickness T2 of the portion 1032. T1 may be less than T2.

The via 108 may terminate at the nitride semiconductor layer 103. The via 108 may terminate at the portion 1031 of the nitride semiconductor layer 103. The via 108 may terminate at an upper surface of the nitride semiconductor layer 103. The via 108 may be in contact with the nitride semiconductor layer 103. The via 108 may be spaced apart from the electrode 105 by the nitride semiconductor layer 103. The via 108 may penetrate a portion of the nitride semiconductor layer 103. The via 108 may not penetrate the nitride semiconductor layer 103 completely. The lower surface of the via 108 may not be coplanar with the upper surface of the electrode 105. The lower surface of the via 108 may not be coplanar with the lower surface of the nitride semiconductor layer 103. The lower surface of the via 108 may have a height higher than the upper surface of the electrode 105. The lower surface of the via 108 may have a height higher than the lower surface of the nitride semiconductor layer 103.

The via 108 may include a layer 1081, a layer 1082 and a layer 1083. The layer 1081 may be in contact with the portion 1031 of the nitride semiconductor layer 103. The layer 1081 may include a material that may reduce the barrier caused by the nitride semiconductor layer 103. The layer 1081 may include SiN, AlN or other suitable materials. The layer 1082 may be disposed on the layer 1081. The layer 1082 may be spaced apart from the nitride semiconductor layer 103 by the layer 1081. The layer 1082 may include a material that may reduce the barrier caused by the nitride semiconductor layer 103. The layer 1082 may serve as an anti-diffusion layer that prevent atom(s) in the layer 1083 entering the layer 1081. For example, the layer 1082 may include titanium, titanium nitride or other suitable materials or other suitable materials. The layer 1083 may be disposed on the layer 1082. The layer 1083 may include, such as Cu or other suitable materials. The layer 1083 may be spaced apart from the nitride semiconductor layer 103 by the layer 1081 and the layer 1082. Since a portion of nitride semiconductor layer 103 serves as a residue and is disposed between the electrode 105 and the via 108, the nitride semiconductor layer 103 may cause a barrier obstructing the electrical connection between the via 108 and the electrode 105 and may adversely form a ohmic contact. In this embodiment, the layer 1081 may reduce the barrier caused by the portion 1031. The layer 1081 may assist in increasing the concentration of electron(s) in the nitride semiconductor layer 103, thereby reducing the barrier of ohmic contact. In this embodiment, the layer 1082 may reduce the barrier caused by the portion 1031. The layer 1082 may assist in increasing the concentration of electron(s) in the nitride semiconductor layer 103, thereby reducing the barrier of ohmic contact. It is contemplated that the via 108 may include an additional layer between the layer 1081 and the nitride semiconductor layer 103.

FIG. 5 is a partial cross-sectional view of a semiconductor device structure 1c in accordance with some embodiments of the present disclosure.

The via 108 may terminate at the electrode 105. The via 108 may penetrate a portion of the electrode 105. The lower surface of the via 108 may not be coplanar with the upper surface of the electrode 105. The lower surface of the via 108 may be lower than the upper surface of the electrode 105. The lower surface of the via 108 may not be coplanar with the lower surface of the nitride semiconductor layer 103. The lower surface of the via 108 may be lower than the lower surface of the nitride semiconductor layer 103. The upper surface of the nitride semiconductor layer 103 may be recessed. The nitride semiconductor layer 103 may have a concave surface.

FIG. 6, FIG. 7, FIG. 8, FIG. 9, FIG. 10, FIG. 11, and FIG. 12 illustrate various stages of a method for manufacturing a semiconductor device structure in accordance with some embodiments of the present disclosure.

Figure 6:
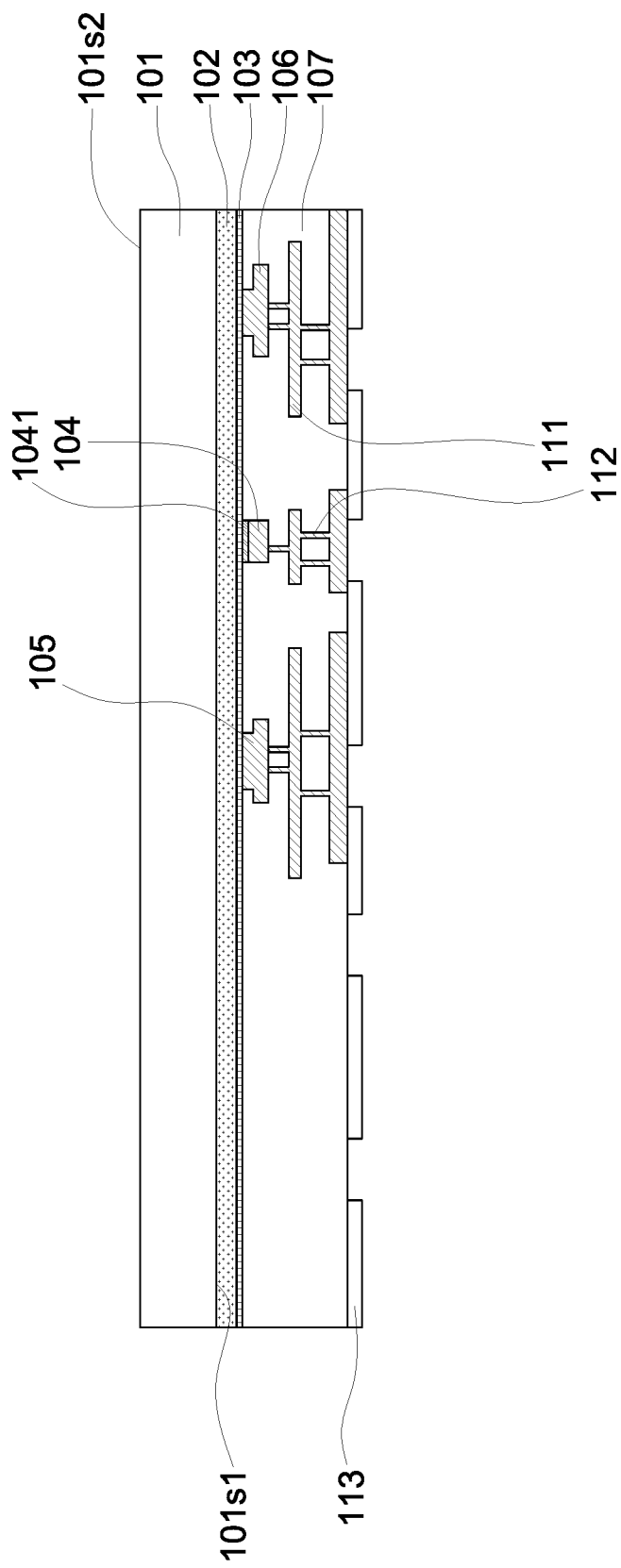
FIG. 6, FIG. 7, FIG. 8, FIG. 9, FIG. 10, FIG. 11 and FIG. 12 illustrate various stages of a method for manufacturing a semiconductor device structure in accordance with some embodiments of the present disclosure.

Referring to FIG. 6, a substrate 101 is provided. A nitride semiconductor layer 102, nitride semiconductor layer 103, gate electrode 104, nitride semiconductor layer 1041, electrode 105, electrode 106, dielectric layer 107, conductive layer 111, through-via 112, passivation layer 113 may be formed on a surface 101s1 of the substrate 101.

Figure 7:
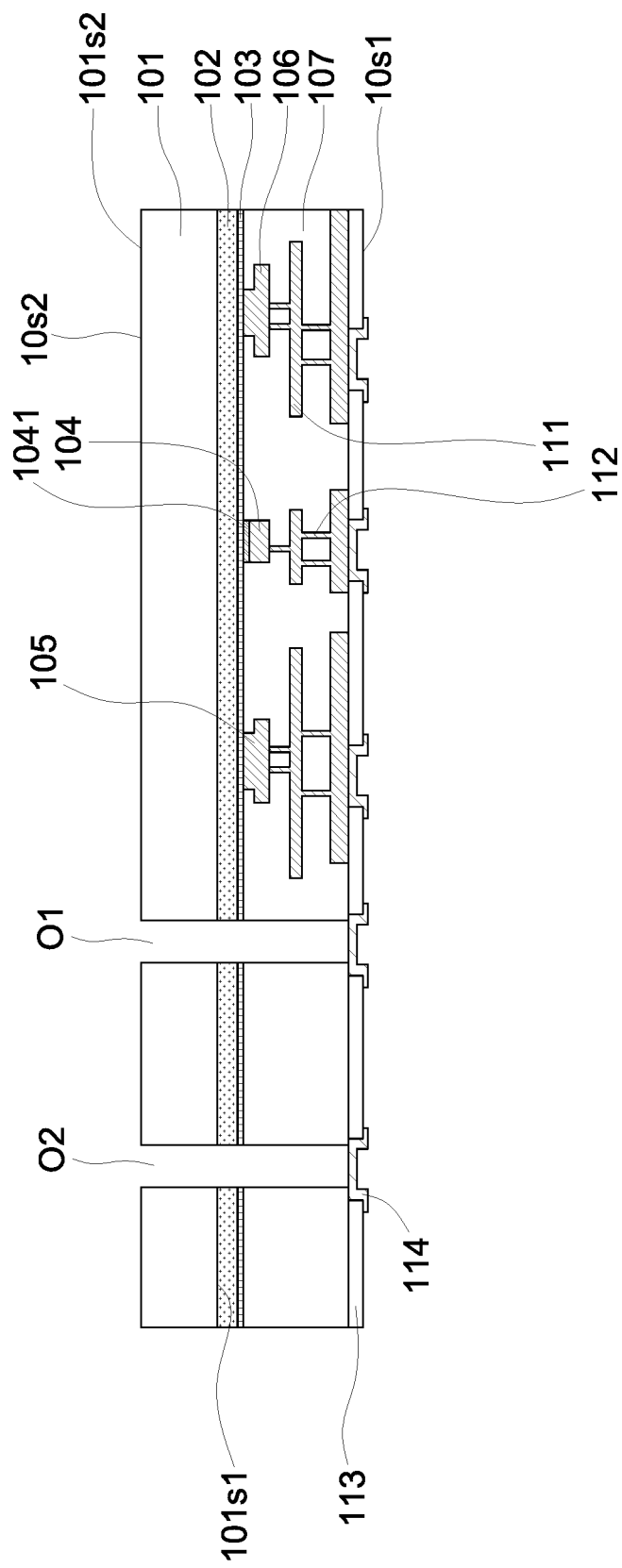

Referring to FIG. 7, pad(s) 114 may be formed on the passivation layer 113, and an opening O1 and an opening O2 may be formed. The opening O1 and opening O2 may be formed by an etch technique, such as dry etching or wet etching. The opening O1 and O2 may extend from the surface 101s2 of the substrate 101. The opening O1 may penetrate the substrate 101, the nitride semiconductor layer 102, the nitride semiconductor layer 103 and the dielectric layer 107. The opening O2 may penetrate the substrate 101, the nitride semiconductor layer 102, the nitride semiconductor layer 103 and the dielectric layer 107.

Figure 8:
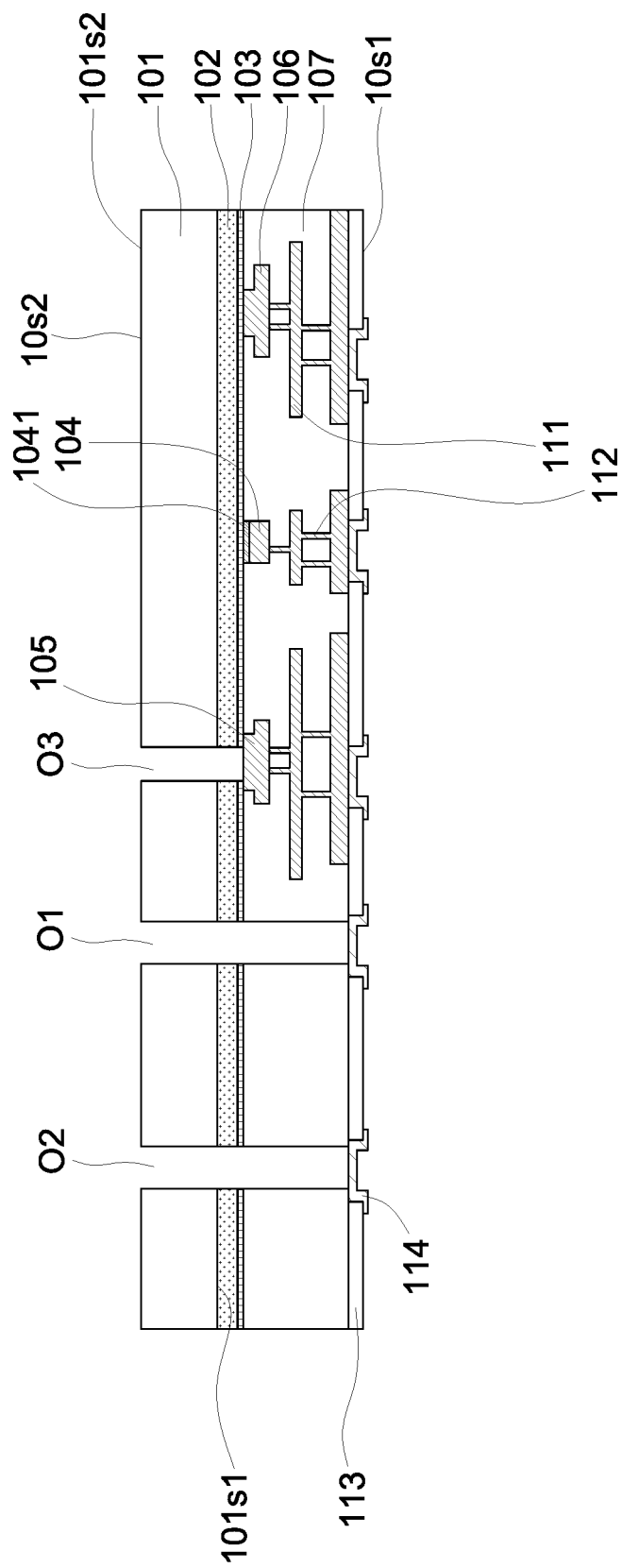

Referring to FIG. 8, an opening O3 may be formed such that an upper surface of the electrode 105 is exposed thereby. The opening O3 may penetrate the substrate 101, the nitride semiconductor layer 102 and the nitride semiconductor layer 103. The opening O3 may terminate at the electrode 105. The opening O3 may be a blind hole, with a closed end at the electrode 105. The opening O3 may be formed by an etch technique, such as dry etching or wet etching. The opening O3 may be formed by a plasma etching technique. The steps for forming the opening O3 and the opening O2 may be different.

Figure 9:
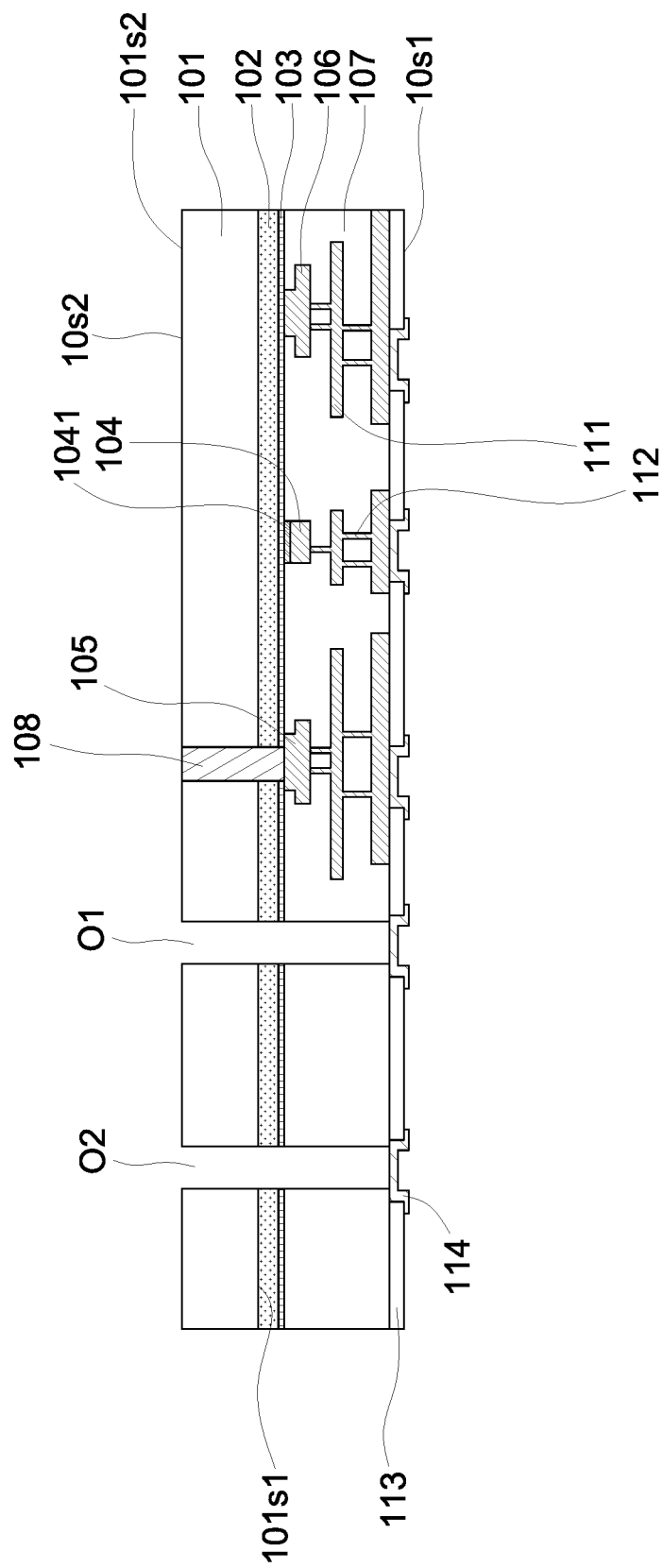

Referring to FIG. 9, a via 108 may be formed. A conductive material, such as Ti, Cu, Al or other suitable materials, may be filled in the opening O3 such that the via 108 is formed. For example, a titanium layer may be formed, and then Al—Cu alloy may be deposited on titanium layer, filling the opening O3, thereby forming the via 108.

Figure 10:
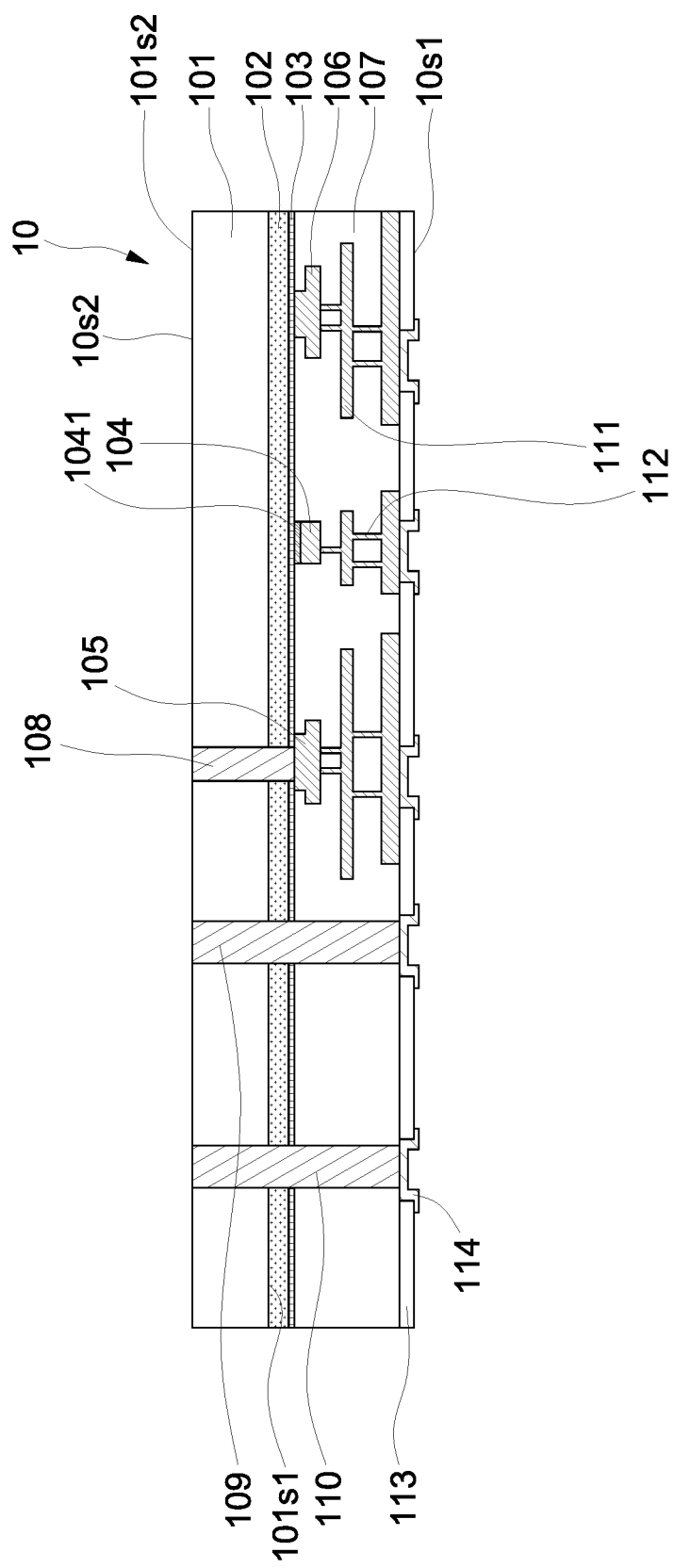

Referring to FIG. 10, a via 109 and a via 110 may be formed to constitute the electronic component 10. A conductive material, such as Al, Cu or other suitable materials, may be filled in the opening O1 and the opening O2 such that the via 109 and the via 110 are formed.

Figure 11:
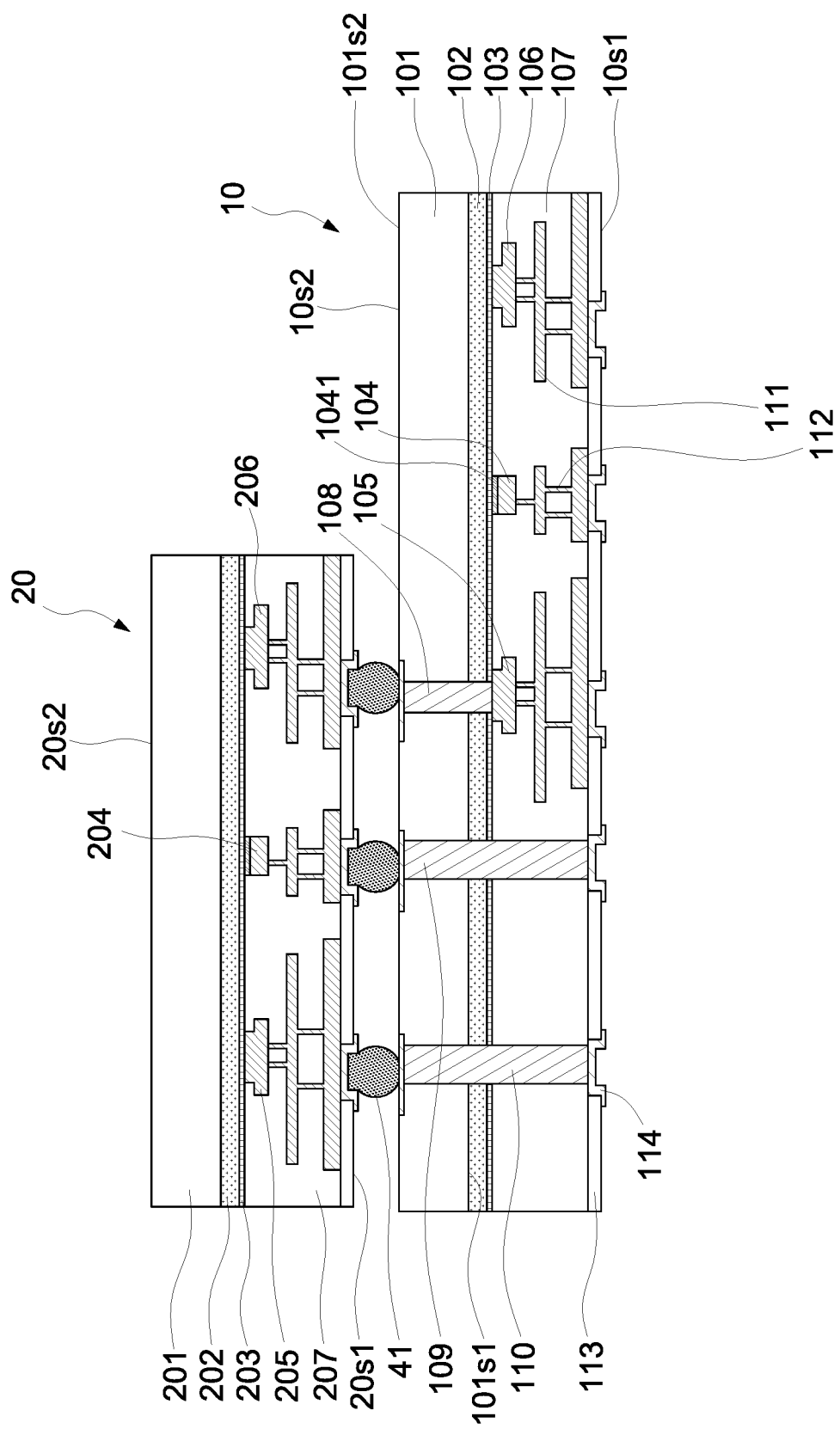

Referring to FIG. 11, an electronic component 20 may be formed on the surface 10s2 of the electronic component 10. The electronic component 20 may be mounted on the electronic component 10 through terminals 41.

Figure 12:
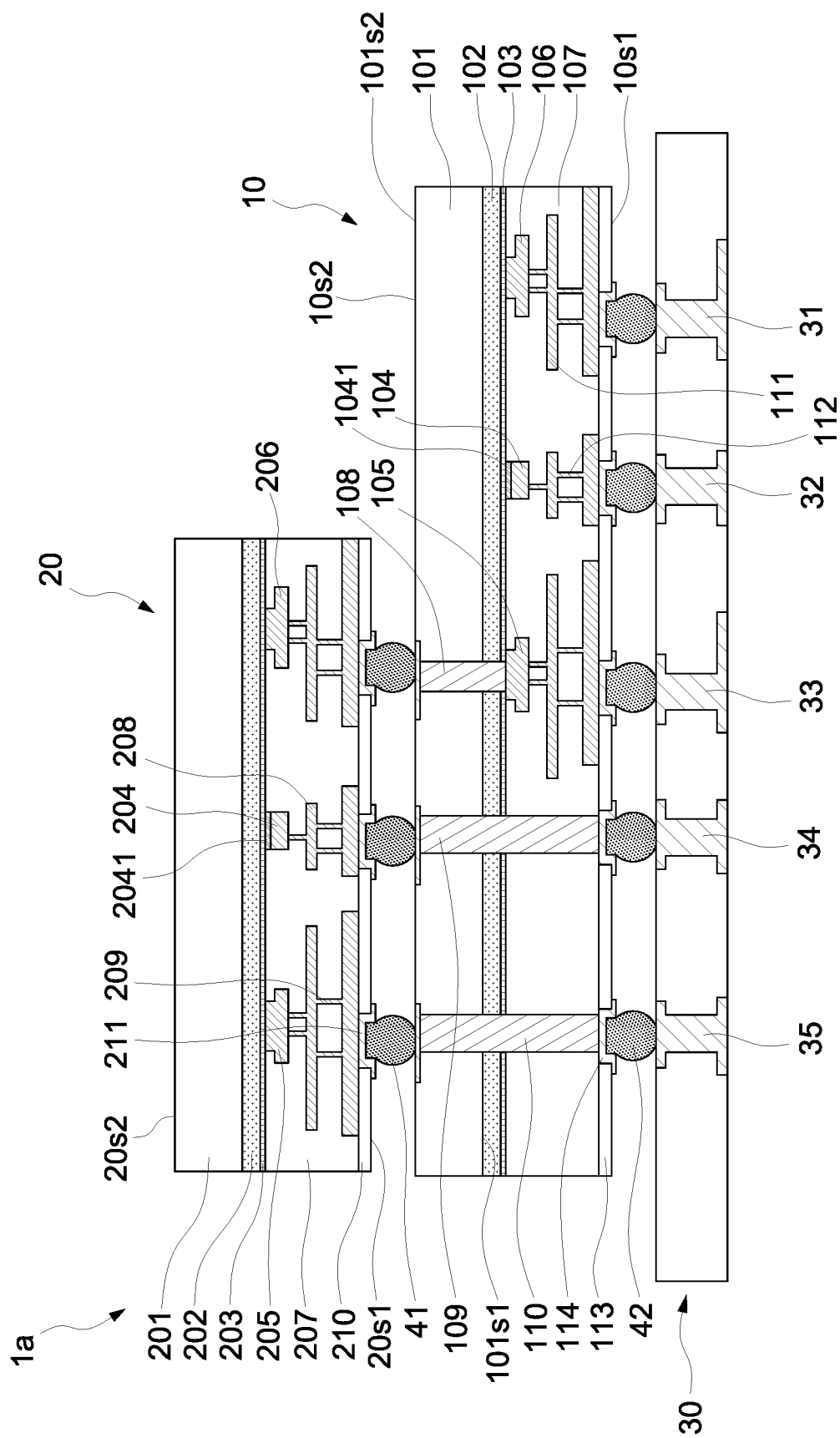

Referring to FIG. 12, a circuit board 30 may be formed on the surface 10s1 of the electronic component 10. The circuit board 30 may be mounted on the electronic component 10 through terminals 42 to form a semiconductor device structure the same as or similar to the semiconductor device structure 1a as described and illustrated in FIG. 1.

It can be contemplated that in the stage of FIG. 8, if the opening O3 does not completely penetrate the nitride semiconductor layer 103 (e.g., etching the nitride semiconductor layer 103 for a relatively shorter duration), a layer 1081, a layer 1082 and a layer 1083 (shown in FIG. 4) may be subsequently formed to fill the opening O3. As a result, a semiconductor device structure the same as or similar to the semiconductor device structure 1b as illustrated and described with reference to FIG. 4 can be formed with subsequent operations as illustrated and described with reference to FIG. 9, FIG. 10, FIG. 11, and FIG. 12.

It can be contemplated that in the stage of FIG. 8, if the nitride semiconductor layer 103 is over etched (e.g., etching the nitride semiconductor layer 103 for a relatively long duration), the electrode 105 may be exposed through the opening O3, a semiconductor device structure the same as or similar to the semiconductor device structure 1c as illustrated and described with reference to FIG. 5 can be formed with subsequent operations as illustrated and described with reference to FIG. 9, FIG. 10, FIG. 11, and FIG. 12.

As used herein, spatially relative terms, such as "beneath," "below," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 80° or other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (1 μm) of lying along a same plane, such as within 10 μm within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure, comprising:
   a substrate having a first surface and a second surface opposite to the first surface;
   a first nitride semiconductor layer disposed on the first surface of the substrate;
   a second nitride semiconductor layer disposed on the first nitride semiconductor layer and having a bandgap greater than that of the first nitride semiconductor layer;
   a gate electrode disposed on the second nitride semiconductor layer;
   a first electrode disposed on the second nitride semiconductor layer;
   a first via extending from the second surface and electrically connected to the first electrode; and
   a second via extending from the second surface of the substrate, beyond a connection between the first via and the first electrode, to a first surface of the semiconductor device structure; wherein the semiconductor device structure comprises the first surface and a second surface opposite to the first surface; the second surface of the semiconductor device structure is the second surface of the substrate; a depth of the first via is smaller than a depth of the second via;
   wherein the semiconductor device structure further comprises a dielectric layer which is disposed between the second nitride semiconductor layer and the first surface of the semiconductor device structure and covers the first electrode;
   wherein the first via is disposed between the second surface of the substrate and the first electrode without entering the dielectric layer, while the second via is disposed between the second surface of the substrate and the first surface of the semiconductor device structure with penetrating the dielectric layer.

2. The semiconductor device structure of claim 1, wherein the dielectric layer is disposed on the second nitride semiconductor layer and covers the gate electrode.

3. The semiconductor device structure of claim 1, wherein a material of the second via is different from a material of the first via.

4. The semiconductor device structure of claim 1, wherein the second nitride semiconductor layer comprises a first portion between the first electrode and the first via.

5. The semiconductor device structure of claim 4, wherein the second nitride semiconductor layer comprises a second portion between the gate electrode and the substrate, and a first thickness of the first portion is less than a second thickness of the second portion.

6. The semiconductor device structure of claim 4, wherein the first via comprises a first barrier adjustment layer in contact with the first portion of the second nitride semiconductor layer.

7. The semiconductor device structure of claim 6, wherein the first barrier adjustment layer comprises silicon nitride or aluminum nitride.

8. The semiconductor device structure of claim 7, wherein the first via comprises a second barrier adjustment layer on the first barrier adjustment layer.

9. The semiconductor device structure of claim 8, wherein the second barrier adjustment layer comprises titanium or titanium nitride.

10. A semiconductor device structure, comprising:
    a first electronic component having an active surface and a back surface opposite to the active surface; and
    a second electronic component electrically connected to the first electronic component and having an active surface facing the back surface of the first electronic component,
    wherein the first electronic component comprises:
       a substrate adjacent to the back surface of the first electronic component;
       a first nitride semiconductor layer disposed on the substrate;
       a second nitride semiconductor layer disposed on the first nitride semiconductor layer and having a bandgap greater than that of the first nitride semiconductor layer;
       a gate electrode disposed on the second nitride semiconductor layer;
       a first electrode disposed on the second nitride semiconductor layer; and
       a first via extending from the back surface of the first electronic component and electrically connected to the first electrode of the first electronic component and the second electronic component;
    wherein the first electronic component comprises a second via extending from the back surface, beyond a connection between the first via and the first electrode, to the active surface of the first electronic component, wherein a depth of the first via is smaller than a depth of the second via;
    wherein the first electronic component further comprises a dielectric layer which is disposed between the second nitride semiconductor layer and the active surface of the first electronic component and covers the first electrode;
    wherein the first via is disposed between the back surface of the first electronic component and the first electrode without entering the dielectric layer, while the second via is disposed between the back surface of the first electronic component and the active surface of the first electronic component with penetrating the dielectric layer.

11. The semiconductor device structure of claim 10, further comprising:
    a first terminal disposed between the first electronic component and the second electronic component.

12. The semiconductor device structure of claim 11, wherein the first terminal is vertically aligned to the first via.

13. The semiconductor device structure of claim 10, further comprising:
    a circuit board disposed on the active surface of the first electronic component.

14. The semiconductor device structure of claim 13, wherein the second electronic component is electrically connected to the circuit board through the second via.

15. The semiconductor device structure of claim 14, wherein the first electronic component comprises a third via extending from the back surface and toward the active surface of the first electronic component, and the second electronic component comprises a gate electrode, a first electrode, and a second electrode, wherein the gate electrode of the second electronic component is electrically connected to the circuit board through the second via, the first electrode of the second electronic component is electrically connected to the circuit board through the third via, and the second electrode of the second electronic component is electrically connected to the first electrode of the first electronic component through the first via.

16. The semiconductor device structure of claim 10, wherein the first via terminates at a surface of the second nitride semiconductor layer.

17. The semiconductor device structure of claim 10, wherein the first via terminates at a surface of the first electrode of the first electronic component.

18. A method of manufacturing a semiconductor device structure, comprising:
   providing a first electronic component having an active surface and a back surface opposite to the active surface, the first electronic component comprising:
      a substrate adjacent to the back surface of the first electronic component;
      a first nitride semiconductor layer disposed on the substrate;
   a second nitride semiconductor layer disposed on the first nitride semiconductor layer and having a bandgap greater than that of the first nitride semiconductor layer;
   a gate electrode disposed on the second nitride semiconductor layer; and
   a first electrode disposed on the second nitride semiconductor layer;
   forming a first via extending between the back surface and the first electrode of the first electronic component; and
   mounting a second electronic component on the first electronic component, wherein the second electronic component is electrically connected to the first electrode through the first via;

wherein the method further comprises: forming a second via extending from the back surface, beyond a connection between the first via and the first electrode, to the active surface of the first electronic component, wherein a depth of the first via is smaller than a depth of the second via;

wherein the first electronic component further comprises a dielectric layer which is disposed between the second nitride semiconductor layer and the active surface of the first electronic component and covers the first electrode;

wherein the first via is disposed between the back surface of the first electronic component and the first electrode without entering the dielectric layer, while the second via is disposed between the back surface of the first electronic component and the active surface of the first electronic component with penetrating the dielectric layer.

19. The method of claim 18, further comprising:
   mounting a circuit board on the active surface of the first electronic component, wherein the second electronic component is electrically connected to the circuit board through the second via.

20. The method of claim 19, where forming the first via comprises:
   forming a blind hole extending between the back surface and the second nitride semiconductor layer of the first electronic component;
   forming a first barrier adjustment layer on the second nitride semiconductor layer;
   forming a second barrier adjustment layer on the first barrier adjustment layer; and
   forming a conductive material on the second barrier adjustment layer to form the first via.

* * * * *